United States Patent
Shiratori et al.

(10) Patent No.: US 11,798,995 B2
(45) Date of Patent: Oct. 24, 2023

(54) HETERO-JUNCTION BIPOLAR TRANSISTOR AND METHOD FOR MANUFACTURING THE SAME

(71) Applicant: Nippon Telegraph and Telephone Corporation, Tokyo (JP)

(72) Inventors: Yuta Shiratori, Tokyo (JP); Takuya Hoshi, Tokyo (JP); Minoru Ida, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 98 days.

(21) Appl. No.: 17/616,123

(22) PCT Filed: Jun. 4, 2019

(86) PCT No.: PCT/JP2019/022152
§ 371 (c)(1),
(2) Date: Dec. 2, 2021

(87) PCT Pub. No.: WO2020/245907
PCT Pub. Date: Dec. 10, 2020

(65) Prior Publication Data
US 2022/0231130 A1    Jul. 21, 2022

(51) Int. Cl.
*H01L 29/205* (2006.01)
*H01L 29/08* (2006.01)
(Continued)

(52) U.S. Cl.
CPC ........ *H01L 29/205* (2013.01); *H01L 29/0817* (2013.01); *H01L 29/0821* (2013.01); *H01L 29/1004* (2013.01); *H01L 29/207* (2013.01); *H01L 29/401* (2013.01); *H01L 29/41708* (2013.01); *H01L 29/42304* (2013.01); *H01L 29/66318* (2013.01); *H01L 29/737* (2013.01)

(58) Field of Classification Search
CPC .......... H01L 29/1004; H01L 29/42304; H01L 29/66318; H01L 29/737; H01L 29/7371
See application file for complete search history.

(56) References Cited

U.S. PATENT DOCUMENTS

2020/0119170 A1*   4/2020 Ok ........................ H01L 29/401

FOREIGN PATENT DOCUMENTS

JP          2012227245 A     11/2012
JP          2019079976 A     5/2019

OTHER PUBLICATIONS

Chen, S. et al., "InGaAsSb/InP Double Heterojunction Bipolar Transistors Grown by Solid-Source Molecular Beam Epitaxy," IEEE Electron Device Letters, vol. 28, No. 8, Aug. 2007, 3 pages.
(Continued)

*Primary Examiner* — Syed I Gheyas
(74) *Attorney, Agent, or Firm* — Slater Matsil, LLP (57) ABSTRACT

A first collector layer is composed of n-type InP (n-InP) doped with Si at a low concentration. A second collector layer is composed of non-doped InGaAs. A base layer is composed of p-type GaAsSb ($p^+$-GaAsSb) doped with C at a high concentration. An emitter layer is composed of a compound semiconductor different from that of the base layer, and has an area smaller than the base layer in a plan view. An emitter layer can be composed of, for example, n-type InP (n-InP) doped with Si at a low concentration.

12 Claims, 9 Drawing Sheets

(51) Int. Cl.
    *H01L 29/10*           (2006.01)
    *H01L 29/207*         (2006.01)
    *H01L 29/40*           (2006.01)
    *H01L 29/417*         (2006.01)
    *H01L 29/423*         (2006.01)
    *H01L 29/66*           (2006.01)
    *H01L 29/737*         (2006.01)

(56) References Cited

OTHER PUBLICATIONS

Thiam, A. et al., "InP HBT Thermal Management by Transferring to High Thermal Conductivity Silicon Substrate," IEEE Electron Device Letters, vol. 35, No. 10, Oct. 2014, 3 pages.

\* cited by examiner

HETERO-JUNCTION BIPOLAR TRANSISTOR AND METHOD FOR MANUFACTURING THE SAME

This patent application is a national phase filing under section 371 of PCT/JP2019/022152, filed on Jun. 4, 2019, which application is hereby incorporated herein by reference.

TECHNICAL FIELD

The present invention relates to a heterojunction bipolar transistor and a method of manufacturing the heterojunction bipolar transistor.

BACKGROUND

Double heterojunction bipolar transistors (DHBTs), in which a base layer is composed of gallium arsenide antimony (GaAsSb) and a collector layer is composed of indium phosphorus (InP), have a type-II band lineup with no conduction band barrier from the base layer to the collector layer, and can obtain high injection current density and dielectric breakdown voltage. That is, the double heterojunction bipolar transistors described above are excellent in high speed and high output. In recent years, high current density exceeding 20 mA/μm2 has been promoted toward higher speed and higher output of heterojunction bipolar transistors.

On the other hand, simply increasing current density causes a problem such as a decrease in reliability of a heterojunction bipolar transistor or a decrease in current gain due to a rise in element temperature. In order to solve this problem, a technique of forming the heterojunction bipolar transistor as described above on a heat dissipating substrate composed of silicon (Si) or the like having a more excellent thermal conductivity than InP is proposed (Non Patent Literature 1).

Figure 3A:
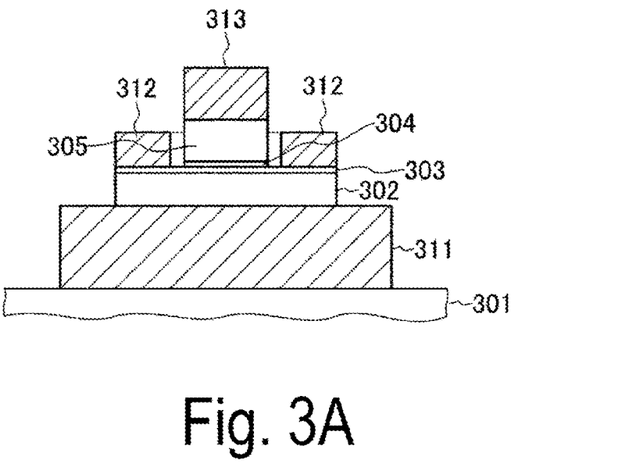
FIG. 3A is a cross-sectional view illustrating a general double heterojunction bipolar transistor.
Figure 3B:
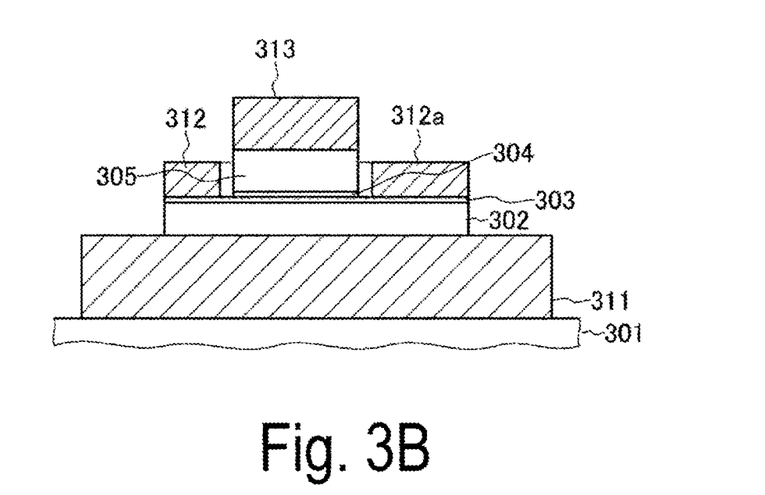
FIG. 3B is a cross-sectional view illustrating the general double heterojunction bipolar transistor.

Hereinafter, the DHBT will be described with reference to FIGS. 3A and 3B. This DHBT includes, on the substrate 301 composed of Si having excellent heat dissipation, a collector layer 302 composed of a compound semiconductor (for example, InP) to which n-type impurities are added at a low concentration, a base layer 303 composed of a compound semiconductor (for example, GaAsSb) to which p-type impurities are added at a high concentration, and an emitter layer 304 composed of a compound semiconductor (for example, InAlAs) to which n-type impurities are added at a low concentration. In addition, a collector electrode 311 composed of a metal is formed below the collector layer 302.

Meanwhile, in this type of DHBT, an element portion including the collector layer 302, the base layer 303, and the emitter layer 304 is formed in a rectangular shape (planar shape) of which the length in a first direction is larger than the length in a second direction perpendicular to the first direction in a plan view. FIG. 3A illustrates a cross section of a plane perpendicular to the first direction, and FIG. 3B illustrates a cross section of a plane perpendicular to the second direction.

Further, base electrodes 312 are formed on the base layer 303 around the emitter layer 304. In addition, an emitter electrode 313 is formed on the emitter layer 304 via an emitter cap layer 305 composed of a compound semiconductor (for example, InGaAs) to which n-type impurities are added at a high concentration.

In this example, the collector electrode 311 also has a function as an adhesive layer when compound semiconductor layers from the emitter layer 304 to the collector layer 302 and the substrate 301 are mechanically bonded.

In addition, the base electrodes 312 are formed to surround the outer circumferential portion of an emitter to reduce base resistance. In addition, as illustrated in FIG. 3B, in the first direction, one base pad electrode 312a of the base electrodes 312 formed on both sides of the emitter is formed to be wider in the first direction in a plan view than the base electrode 312 in the other region for connection with an upper-layer wiring to function as a pad portion. The width of the base pad electrode 312a in the first direction is typically approximately 1 μm larger than the base electrode 312.

In the DHBT having the above-described configuration, the collector electrode 311 and the substrate 301 having a higher thermal conductivity than an InP-based material are provided directly below the collector layer 302 to improve heat dissipation in the direction of the back surface of the substrate as compared with the DHBT formed on an InP substrate. As a result, in the DHBT, the injection current density can be increased while suppressing a decrease in reliability due to a rise in element temperature, and the speed and the output can be further increased.

CITATION LIST

Non Patent Literature

Non Patent Literature 1: A. Thiam et al., "InP HBT Thermal Management by Transferring to High Thermal Conductivity Silicon Substrate," IEEE Electron Device Letters, vol. 35, no. 10, pp. 1010-1012, 2014.

SUMMARY

Technical Problem

In order to more effectively improve the high-frequency characteristics of the DHBT of the related art described above, it is desirable to reduce the area of the base layer and the collector layer in a plan view and to reduce base-collector parasitic capacitance, in conjunction with high current density. However, in order to establish such a configuration, there are problems specific to the structure of the above DHBT as will be described below.

First, the base layer and the collector layer are generally formed in a self-aligned manner by removing unnecessary regions of a base forming layer and a collector forming layer by etching using the base electrode formed on the base layer as a mask. Thus, in order to reduce the areas of the base layer and the collector layer in a plan view, it is also necessary to reduce the area of the base electrode at the same time (reduce the width of the base electrode when viewed from the cross section).

On the other hand, in a case where the area of the base electrode is simply reduced, the resistance of the base electrode increases and the effect of improving high-frequency characteristics by reducing parasitic capacitance is limited. Consequently, it is desirable to further increase the thickness of the base electrode to maintain the resistance of the base electrode, but in this case, the risk of a short circuit between the base electrode and the emitter electrode increases. Alternatively, the layer thickness of a resist required for patterning (typically, it needs to be several tens of percent larger than the thickness of the base electrode)

becomes larger, and thus there is concern of the patterning itself becoming difficult and the yield rate decreasing.

Based on this, in order to obtain a maximum effect of improving high-frequency characteristics without tradeoff with other characteristics or yield rate, it is desirable for only the areas of the base layer and the collector layer to be able to be reduced without reducing the area of the base electrode.

However, in the DHBT described above, it is very difficult to make the areas of the base layer and the collector layer smaller than the area of the base electrode with good controllability. Generally, a simplest method of reducing the areas of the base layer and the collector layer is to also etch the base layer in the lateral direction which is the surface direction of the substrate when the base layer is formed by etching. However, even if a base layer composed of GaAsSb is wet-etched with an etchant containing a typical citric acid as a main component, there is a material-specific problem that the base layer is etched in the depth direction (<100> direction), but can hardly be etched in the lateral direction (<010> or <001> direction).

As another method, a method in which a collector layer composed of InP is side-etched and then the base layer is etched again can also be considered. However, a typical hydrochloric acid-based etchant of InP is characterized in that the etching rate in the oblique 45° direction (<011>, <01-1>, <0-11>, <0-1-1> direction) with respect to the plane surface of the substrate is much faster than in the lateral direction, which makes shape control very difficult.

In another method, even if some kind of layer that can be precisely side-etched is inserted into the interface between the collector layer and the collector electrode, and the collector layer composed of InP and the base layer composed of GaAsSb are etched again to reduce the area of the base layer and the area of the collector layer, it is ultimately difficult to control etching of the InP collector layer in the oblique direction. This makes it difficult to precisely control the areas of the base layer and the collector layer.

In principle, changing the above etchant to a different one is also one method, but it is obvious that it is difficult to obtain a new etchant for realizing various elements required for wet etching of the base layer and the collector layer (an etching rate, a material selection ratio, a high vertical cross-sectional shape, and the stability of an etchant over time) at a high level.

As described above, in the aforementioned DHBT, there is a problem that it is difficult to reduce the base-collector parasitic capacitance and to improve the high-frequency characteristics without increasing the resistance of the base electrode and reducing the yield rate of element manufacturing.

Embodiments of the present invention can solve the above problems, and an object thereof is to reduce the base-collector parasitic capacitance and to improve the high-frequency characteristics without increasing the resistance of the base electrode and without reducing the yield rate of element manufacturing in a DHBT in which a base layer is composed of GaAsSb and a collector layer is composed of InP.

Means for Solving the Problem

According to embodiments of the present invention, there is provided a heterojunction bipolar transistor including: a collector electrode formed on a substrate; a first collector layer which is formed on the collector electrode and is composed of InP; a second collector layer which is formed on the first collector layer, is composed of InGaAs, and is thinner than the first collector layer; a base layer which is composed of GaAsSb or InGaAsSb formed on the second collector layer; an emitter layer which is formed on the base layer, is composed of a compound semiconductor different from that of the base layer, and has an area smaller than the base layer in a plan view; a base electrode having a portion that is formed on the base layer and is in contact with the base layer around the emitter layer and a portion that extends away from the emitter layer in a plan view without contacting the base layer; and an emitter electrode formed on the emitter layer.

In a configuration example, the heterojunction bipolar transistor further includes a collector contact layer which is formed between the collector electrode and the first collector layer, is composed of InGaAs, and has an area smaller than the first collector layer in a plan view.

In a configuration example, the heterojunction bipolar transistor further includes a third collector layer which is formed between the collector contact layer and the first collector layer and is composed of InP.

In addition, according to embodiments of the present invention, there is provided a method of manufacturing a heterojunction bipolar transistor, the method including: a first step of forming a collector electrode forming layer on a substrate; a second step of sequentially forming, on the collector electrode forming layer, a first collector forming layer composed of InP, a second collector forming layer composed of InGaAs and thinner than the first collector forming layer, a base forming layer composed of GaAsSb or InGaAsSb, and an emitter forming layer composed of a compound semiconductor different from that of the base forming layer; a third step of forming an emitter electrode on the emitter forming layer; a fourth step of forming an emitter layer by patterning the emitter forming layer; a fifth step of forming a base electrode on the base forming layer around the emitter layer; a sixth step of forming a base layer and a second collector layer using a mask pattern and by performing a selective etching process on the first collector forming layer; a seventh step of forming a first collector layer by etching the first collector forming layer using a mask pattern that covers lateral sides of the base layer and the second collector layer; and an eighth step of forming a collector electrode from the collector electrode forming layer, wherein the emitter layer is formed in an area smaller than the base layer in a plan view, and the base electrode is formed in a shape having a portion that is in contact with the base layer around the emitter layer and a portion that extends away from the emitter layer in a plan view without contacting the base layer.

In a configuration example of the method of manufacturing a bipolar transistor, the sixth step includes forming the base layer and the second collector layer by selectively etching only the base forming layer and the second collector forming layer.

In a configuration example, the method of manufacturing a heterojunction bipolar transistor further includes a step of forming a collector contact layer composed of InGaAs and having an area smaller than the first collector layer in a plan view between the collector electrode and the first collector layer.

In a configuration example, the method of manufacturing a heterojunction bipolar transistor further includes a step of forming a third collector layer composed of InP between the collector contact layer and the first collector layer.

Effects of Embodiments of the Invention

As described above, according to embodiments of the present invention, the base-collector parasitic capacitance is reduced and the high-frequency characteristics are improved without increasing the resistance of the base electrode and without reducing the yield rate of element manufacturing in the DHBT in which the base layer is composed of GaAsSb and the collector layer is composed of InP.

DETAILED DESCRIPTION OF ILLUSTRATIVE EMBODIMENTS

Hereinafter, a heterojunction bipolar transistor according to an embodiment of the present invention will be described with reference to FIGS. 1A and 1B.

This heterojunction bipolar transistor includes a collector electrode 111 composed of a metal and formed on a substrate 101, a first collector layer 103 formed on the collector electrode 11, a second collector layer 104 formed on the first collector layer 103, a base layer 105 formed on the second collector layer 104, an emitter layer 106 formed on the base layer 105, and an emitter cap layer 107 formed on the emitter layer 106. The heterojunction bipolar transistor further includes a collector contact layer 102 formed between the collector electrode 11 and the first collector layer 103.

The substrate 101 is preferably composed of a material having a higher thermal conductivity than InP, and can be composed of, for example, SiC, single crystal Si, AlN, diamond, or the like.

The first collector layer 103 is composed of n-type InP (n-InP) doped with Si at a low concentration. The second collector layer 104 is composed of non-doped InGaAs or n-type InGaAs (n-InGaAs) doped with Si at a low concentration. The base layer 105 is composed of p-type GaAsSb ($p^+$-GaAsSb) doped with C at a high concentration. The base layer 105 can also be composed of p-type InGaAsSb ($p^+$-InGaAsSb) doped with C at a high concentration.

The emitter layer 106 is composed of a compound semiconductor different from the base layer 105, and has an area smaller than the base layer 105 in a plan view. The emitter layer 106 can be composed of, for example, n-type InP (n-InP) doped with Si at a low concentration. The emitter cap layer 107 is composed of n-type InGaAs ($n^+$-InGaAs) doped with Si at a high concentration. The collector contact layer 102 is composed of InGaAs, and has an area smaller than the first collector layer 103 in a plan view.

Each layer of these group III-V compound semiconductors is formed with the plane orientation of the main surface as a (100) surface.

In addition, the heterojunction bipolar transistor according to the embodiment includes a base electrode 112 formed on the base layer 105 around the emitter layer 106 and an emitter electrode 113 formed on the emitter layer 106. The base electrode 112 has a portion which is in contact with the base layer 105 around the emitter layer 106 and a portion that extends away from the emitter layer 106 in a plan view without contacting the base layer 105. In addition, the base electrode 112 has a base pad electrode 112a. The base pad electrode 112a is formed to be wider in a first direction in a plan view than the base electrode 112 in the other region for connection with an upper-layer wiring, and functions as a pad portion. The width of the base pad electrode 112a in the first direction is typically approximately 1 μm larger than the base electrode 112. FIG. 1B illustrates a state in which the base pad electrode 112a is formed on the right side of the page.

In addition, this heterojunction bipolar transistor includes an insulating layer 108 that covers the lateral sides of the emitter layer 106 and the emitter cap layer 107. The insulating layer 108 is also formed to cover the lateral side of a portion of the emitter electrode 113 and on the side of the emitter cap layer 107. In addition, the insulating layer 108 is formed to fill a space between the emitter layer 106, the emitter cap layer 107, and the base electrode 112 in the surface direction of the substrate 101. In addition, the insulating layer 108 is formed to cover the upper surface of the base electrode 112. The insulating layer 108 is composed of, for example, a silicon oxide or a silicon nitride.

According to the embodiment, as illustrated in a manufacturing method to be described later, the extremely thin second collector layer 104 that can be side-etched at an appropriately controllable rate is inserted between the base layer 105 and the first collector layer 103, so that a layer serving as the base layer 105 can be side-etched in a pseudo manner during the formation of the base layer 105. More specifically, an InGaAs layer serving as the second collector layer 104 is first side-etched, so that the (100) surface of a GaAsSb layer (the base layer 105) which is in contact with the InGaAs layer is exposed. Because the (100) surface of GaAsSb is etched with citric acid, side etching of the GaAsSb layer (the base layer 105) proceeds in a form in which it follows the side etching of the InGaAs layer that results in the second collector layer 104.

In addition, the first collector layer 103 is formed using the second collector layer 104 as a mask, and the collector contact layer 102 is formed using the first collector layer 103 as a mask. Thereby, in a plan view, the area of the base layer 105 is smaller than the area of the base electrode 112 consisting of the outermost circumference, and the area of the second collector layer 104 is smaller than the area of the base layer 105, so that the area of the collector contact layer 102 can be made smaller than the area of the first collector layer 103. Thereby, in most of a region between the base electrode 112 and the collector electrode 11, it is possible to reduce the proportion of a compound semiconductor having a high relative dielectric constant, that is, it is possible to reduce base-collector parasitic capacitance.

Meanwhile, a third collector layer composed of InP to which n-type impurities are added at a high concentration may be inserted between the first collector layer 103 and the collector contact layer 102, and may be formed simultaneously with the first collector layer 103. Thereby, because an interval between the base electrode 112 and the collector electrode 11 can be expanded, the base-collector parasitic capacitance can be reduced more effectively.

In addition, when a conduction band end from the second collector layer 104 to the first collector layer 103 is viewed, there is a potential barrier of approximately 0.2 eV. However, by sufficiently reducing the thickness of the second collector layer 104, electrons having high energy injected from the base layer 105 to the second collector layer 104 can reach the first collector layer 103 without energy relaxation in the second collector layer 104 (without being hindered by a potential barrier), thereby allowing a current blocking effect to be suppressed.

As described above, according to the heterojunction bipolar transistor of the embodiment, it is possible to reduce the base-collector parasitic capacitance without increasing base electrode resistance, and to speed up an element.

Hereinafter, a method of manufacturing the heterojunction bipolar transistor according to an embodiment of the present invention will be described with reference to FIGS. 2A to 2P.

Figure 2A:
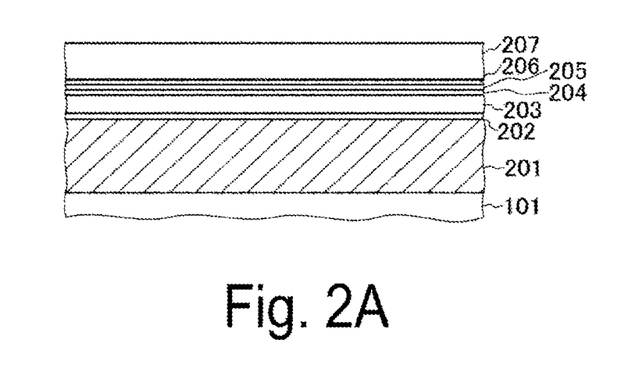
FIG. 2A is a cross-sectional view illustrating a state of an intermediate step for explaining a method of manufacturing a heterojunction bipolar transistor according to an embodiment of the present invention.

First, as illustrated in FIG. 2A, a collector electrode forming layer 201 composed of a metal is formed on the substrate 101 (first step). Next, a collector contact forming layer 202, a first collector forming layer 203, a second collector forming layer 204, a base forming layer 205, an emitter forming layer 206, and an emitter cap forming layer 207 are laminated in that order on the collector electrode forming layer 201 (second step).

For example, the collector contact forming layer 202 is composed of InGaAs, the first collector forming layer 203 is composed of n-InP doped with Si at a low concentration, and the second collector forming layer 204 is composed of non-doped InGaAs or n-InGaAs doped with Si at a low concentration. In addition, the base forming layer 205 is composed of $p^+$-GaAsSb doped with C at a high concentration or $p^+$-InGaAsSb doped with C at a high concentration. The emitter forming layer 206 is composed of, for example, n-InP doped with Si at a low concentration, and the emitter cap forming layer 207 is composed of $n^+$-InGaAs doped with Si at a high concentration.

For example, a growth substrate composed of InP of which the lattice constants in the surface direction of the substrate are lattice-matched is first prepared on InGaAs. The growth substrate has a (100) surface as the plane orientation of the main surface. The emitter cap forming layer 207, the emitter forming layer 206, the base forming layer 205, the second collector forming layer 204, the first collector forming layer 203, and the collector contact forming layer 202 are formed on this growth substrate by crystal growth using an already-known epitaxial growth technique.

Next, the collector contact forming layer 202 grown on the growth substrate and the substrate 101 are bonded together using an already-known substrate bonding technique with the collector electrode forming layer 201 composed of a metal as an adhesive layer. Thereafter, when the growth substrate is removed by etching or the like, each semiconductor layer described above can be formed on the collector electrode forming layer 201.

Incidentally, in order to enhance the effect of embodiments of the invention, a third collector forming layer (not shown) composed of InP to which Si of a high concentration ($>1\times10^{19}$ cm$^{-3}$) is added may be inserted between the first collector forming layer 203 and the collector contact forming layer 202. As the thickness of the collector contact layer and the thickness of the third collector layer are increased, an interval between the base electrode and the collector electrode can be widened, and thus the base-collector parasitic capacitance can be further reduced. However, the thickness of the collector contact layer and the thickness of the third collector layer need to be appropriately set in consideration of collector parasitic resistance and collector heat resistance.

Here, caution is needed because the thickness of the second collector forming layer 204 influences manufacturing of the heterojunction bipolar transistor and the electrical characteristics thereof. For example, when the thickness of the second collector forming layer 204 is reduced excessively, an etchant is not likely to penetrate into voids between the base electrode 112 and the first collector forming layer 203 caused by etching of the second collector forming layer 204. As a result, the above-described side etching becomes difficult. On the other hand, when the thickness of the second collector forming layer 204 is increased excessively, electrons injected from the base layer 105 are subject to energy relaxation in the second collector layer 104.

In this state, there is concern of a current being inhibited from being injected into the first collector layer 103 due to the influence of the potential barrier generated at the interface between the second collector layer 104 and the first collector layer 103. Thus, it is important to set such an appropriate thickness as to be able to suppress current blocking in the second collector forming layer 204 in consideration of electron velocity at the interface between the base layer 105 and the second collector layer 104 and the relaxation time in the second collector layer 104. In addition, the second collector layer 104 is doped with n-type impurities of $1 \times 10^{18}$ to $10^{19}$ cm$^{-3}$, so that it is also possible to achieve suppression of current blocking by lowering a conduction band end at the interface between the second collector layer 104 and the first collector layer 103 viewed from a conduction band end at the interface between the base layer 105 and the second collector layer 104.

Figure 2B:
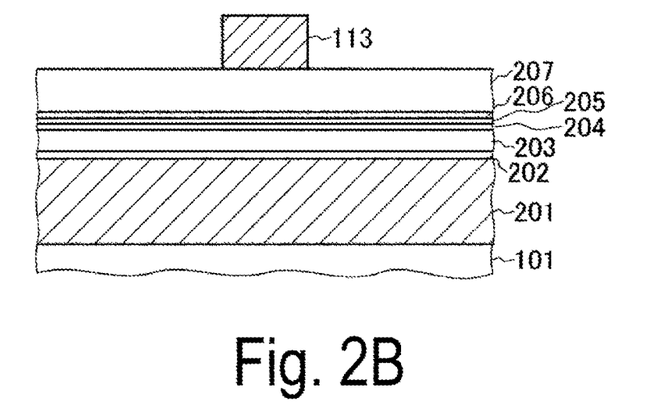
FIG. 2B is a cross-sectional view illustrating a state of an intermediate step for explaining a method of manufacturing the heterojunction bipolar transistor according to an embodiment of the present invention.

Next, as illustrated in FIG. 2B, the emitter electrode 113 is formed on the emitter cap forming layer 207 (third step). For example, a metal layer is formed by depositing a predetermined metal using an already-known deposition method such as a vacuum vapor deposition method or a sputtering method. Next, the emitter electrode 113 is formed by patterning this metal layer using a known lithography technique and a known dry etching technique. The emitter electrode 113 is formed in a planar shape (a rectangular shape) of which the length in the first direction is larger than the length in a second direction perpendicular to the first direction in a plan view.

Figure 2C:
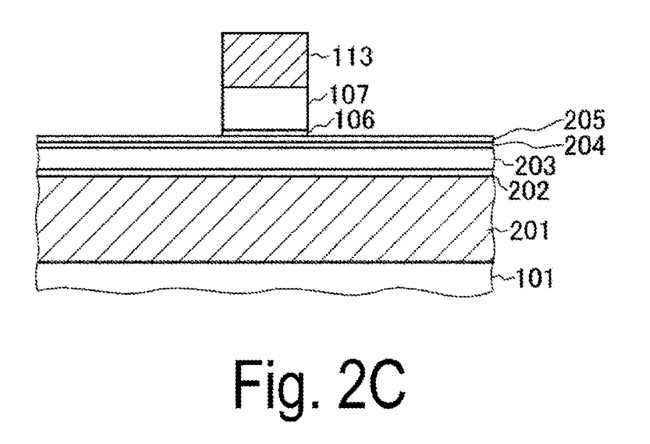
FIG. 2C is a cross-sectional view illustrating a state of an intermediate step for explaining a method of manufacturing the heterojunction bipolar transistor according to an embodiment of the present invention.

Next, as illustrated in FIG. 2C, the emitter cap layer 107 is formed by patterning the emitter cap forming layer 207 through known dry etching, wet etching, or the like using the emitter electrode 113 as a mask. In this example, the emitter cap layer 107 is formed in the same area as the emitter electrode 113. Subsequently, as illustrated in FIG. 2C, the emitter layer 106 is formed by patterning the emitter forming layer 206 through known dry etching, wet etching, or the like using the emitter electrode 113 as a mask (fourth step).

Figure 2D:
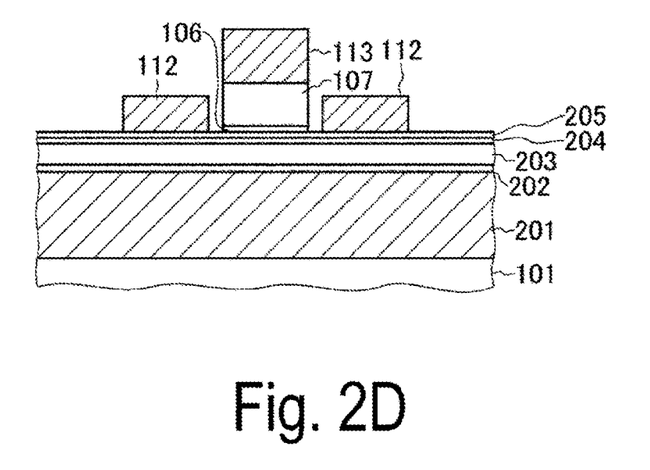
FIG. 2D is a cross-sectional view illustrating a state of an intermediate step for explaining a method of manufacturing the heterojunction bipolar transistor according to an embodiment of the present invention.
Figure 2E:
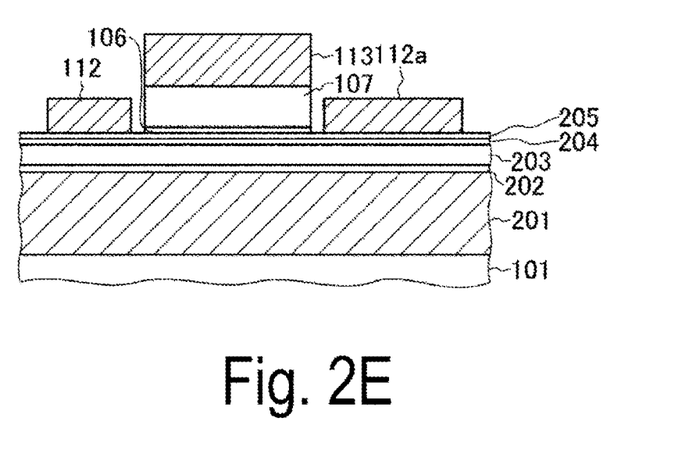
FIG. 2E is a cross-sectional view illustrating a state of an intermediate step for explaining a method of manufacturing the heterojunction bipolar transistor according to an embodiment of the present invention.

Next, as illustrated in FIGS. 2D and 2E, the base electrode 112 is formed on the base forming layer 205 around the emitter layer 106 (fifth step). The base electrode 112 can be formed using, for example, a known vacuum vapor deposition method and a known lift-off method. The base electrode 112 is formed in a shape having a portion which is in contact with the base layer 105 to be formed as will be described later and a portion that extends from the base layer 105 away from the emitter layer 106 in a plan view.

In addition, the base electrode 112 is configured such that at least one side of the base electrode 112 is wider than the other in a cross section perpendicular to the second direction.

In addition, the base electrode 112 is formed in a state in which the base pad electrode 112a is included. The base pad electrode 112a is formed to be wider in the first direction in a plan view than the base electrode 112 in the other region for connection with an upper-layer wiring. The width of the base pad electrode 112a in the first direction is typically approximately 1 μm larger than the base electrode 112. The base pad electrode 112a is a region for connection with an upper-layer wiring, and it is only required that the width in the first direction has desired dimensions in consideration of the resolution of lithography, wiring resistance, or the like.

Figure 2F:
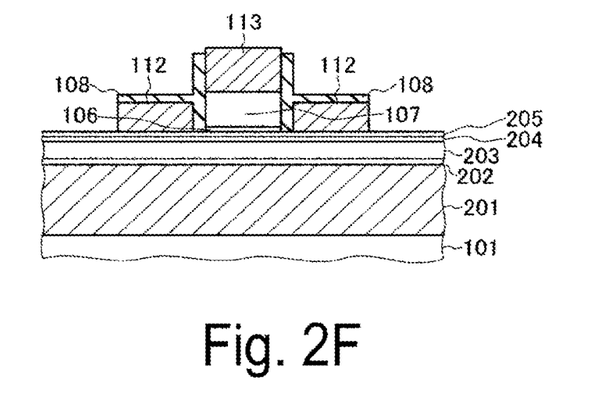
FIG. 2F is a cross-sectional view illustrating a state of an intermediate step for explaining a method of manufacturing the heterojunction bipolar transistor according to an embodiment of the present invention.
Figure 2G:
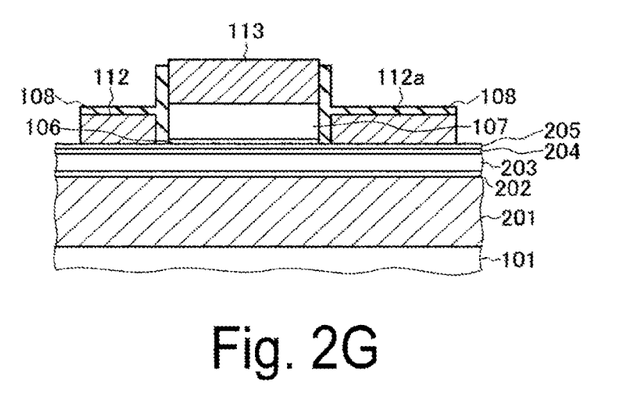
FIG. 2G is a cross-sectional view illustrating a state of an intermediate step for explaining a method of manufacturing the heterojunction bipolar transistor according to an embodiment of the present invention.

Next, as illustrated in FIGS. 2F and 2G, the insulating layer 108 is formed. The insulating layer 108 can be formed of insulating materials such as $SiO_2$, SiN, or SiON deposited using a deposition method such as a known sputtering method or a known chemical vapor deposition (CVD) method. In addition, the insulating layer 108 can also be composed of, for example, benzocyclobutene or $Al_2O_3$. The insulating layer 108, the base layer 105, the second collector layer 104, and the like are formed, and then have a role of reinforcing the mechanical strength of the base electrode 112 (or suppressing contact of the base electrode 112 with the flexible collector electrode 111). The thickness of the insulating layer 108 is only required to be determined in view of processability or mechanical strength, and there is no problem insofar as the thickness, although depending on insulating materials, is at least approximately 100 nm.

Figure 2H:
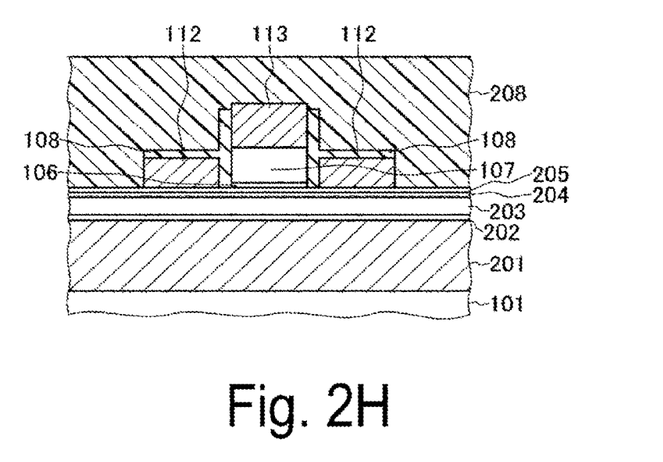
FIG. 2H is a cross-sectional view illustrating a state of an intermediate step for explaining a method of manufacturing the heterojunction bipolar transistor according to an embodiment of the present invention.
Figure 2I:
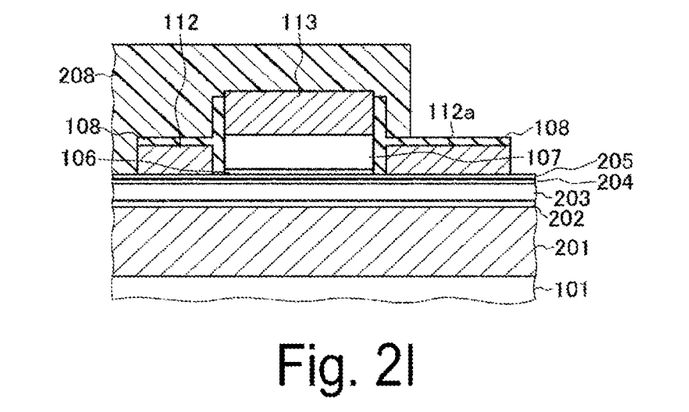
FIG. 2I is a cross-sectional view illustrating a state of an intermediate step for explaining a method of manufacturing the heterojunction bipolar transistor according to an embodiment of the present invention.

Next, a mask pattern 208 is formed using a known lithography technique as illustrated in FIGS. 2H and 2I. A region other than the base pad electrode 112a is coated with the mask pattern 208.

Figure 2J:
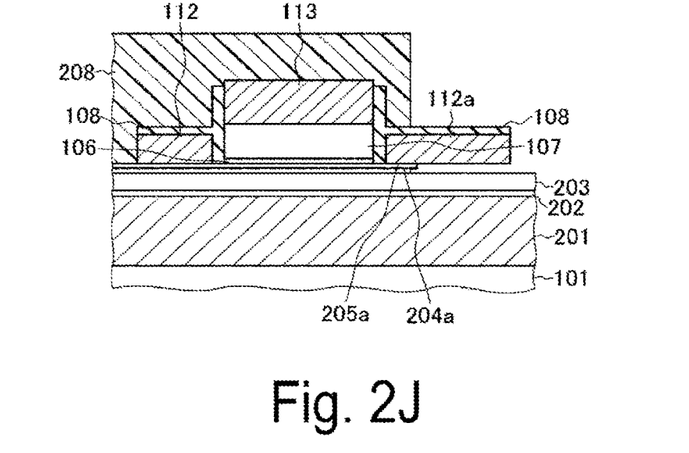
FIG. 2J is a cross-sectional view illustrating a state of an intermediate step for explaining a method of manufacturing the heterojunction bipolar transistor according to an embodiment of the present invention.

Next, as illustrated in FIG. 2J, a portion of base layer 205a and a second collector layer 204a are formed using the mask pattern 208 as a mask and by performing a selective etching process on the first collector forming layer 203 (sixth step). In this step, a portion of the base layer 205a and the second collector layer 204a are formed by selectively etching only the base forming layer 205 and the second collector forming layer 204 through the selective etching process.

For example, the base forming layer 205 and the second collector forming layer 204 directly below the base pad electrode 112a are removed by etching using an etchant containing citric acid as a main component. InGaAs is etched with citric acid, that is, side-etched not only in a <100> direction (a direction perpendicular to the substrate 101) but also in a <010> or <001> direction (a direction parallel to the plane surface of the substrate 101). When the side etching of the second collector forming layer 204 proceeds, the (100) surface of the base forming layer 205 (a surface which is in contact with the second collector forming layer 204) is exposed, and the side etching of the base forming layer 205 proceeds with this exposed surface as a starting point. The side etching rate of InGaAs can be controlled by the temperature or concentration of an etchant, and the amount of side etching can be precisely controlled by time, typically, as slow as several nm per second.

Figure 2K:
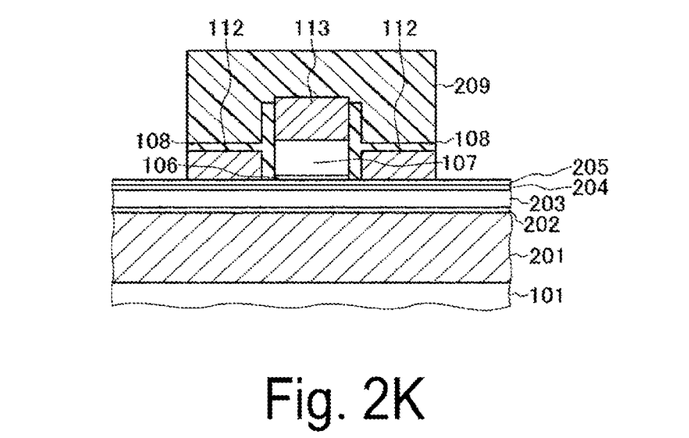
FIG. 2K is a cross-sectional view illustrating a state of an intermediate step for explaining a method of manufacturing the heterojunction bipolar transistor according to an embodiment of the present invention.
Figure 2L:
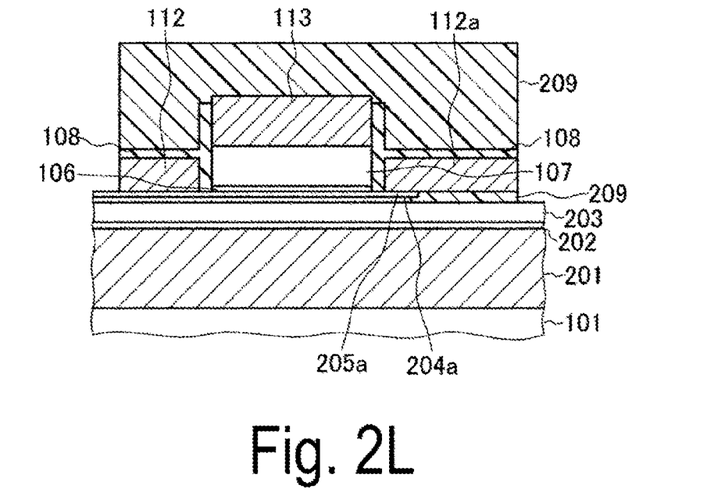
FIG. 2L is a cross-sectional view illustrating a state of an intermediate step for explaining a method of manufacturing the heterojunction bipolar transistor according to an embodiment of the present invention.

Next, after the mask pattern 208 is removed, a mask pattern 209 is newly formed using a known lithography technique as illustrated in FIGS. 2K and 2L. The mask pattern 209 coats the entire surface of the emitter layer 106 and the base electrode 112. In addition, the mask pattern 209 is also formed (filled) directly below the base pad electrode 112a having changed into a void, and can prevent the base layer 205a and the second collector layer 204a directly below the base pad electrode 112a having already been side-etched from being excessively etched when the base layer 105 and the second collector layer 104 to be described later are formed.

Figure 2M:
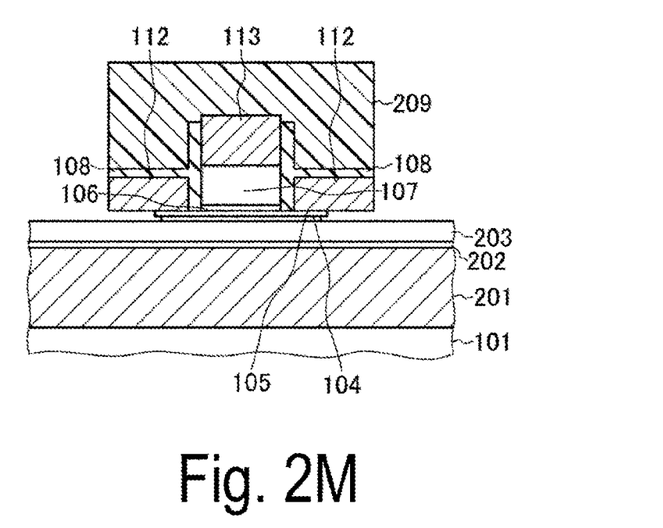
FIG. 2M is a cross-sectional view illustrating a state of an intermediate step for explaining a method of manufacturing the heterojunction bipolar transistor according to an embodiment of the present invention.
Figure 2N:
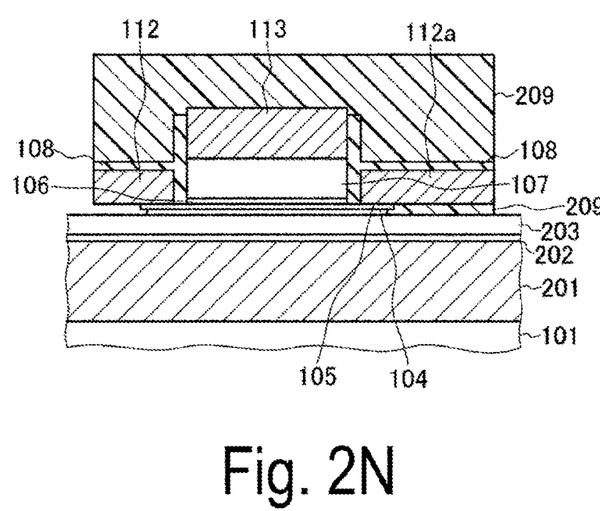
FIG. 2N is a cross-sectional view illustrating a state of an intermediate step for explaining a method of manufacturing the heterojunction bipolar transistor according to an embodiment of the present invention.

Next, the base layer 205a and the second collector layer 204a are etched through a selective etching process using the mask pattern 209 as a mask, and the base layer 105 and the second collector layer 104 are formed as illustrated in FIGS. 2M and 2N (sixth step). Only the base layer 205a and the second collector layer 204a are selectively etched through the selective etching process to form the base layer 105 and the second collector layer 104. In this step, for example, as in the case of etching directly below the base pad electrode 112a, the base layer 205a and the second collector layer 204a are only required to be etched for a desired amount of time, for example, using an etchant containing citric acid as a main component. In a case where the base layer 205a is excessively side-etched, the area of contact between the base electrode 112 and the base layer 105 becomes excessively small, which leads to an increase in base contact resistance. For this reason, the amount of side etching for forming the base layer 105 is appropriately set in consideration of the base contact resistance.

Figure 2O:
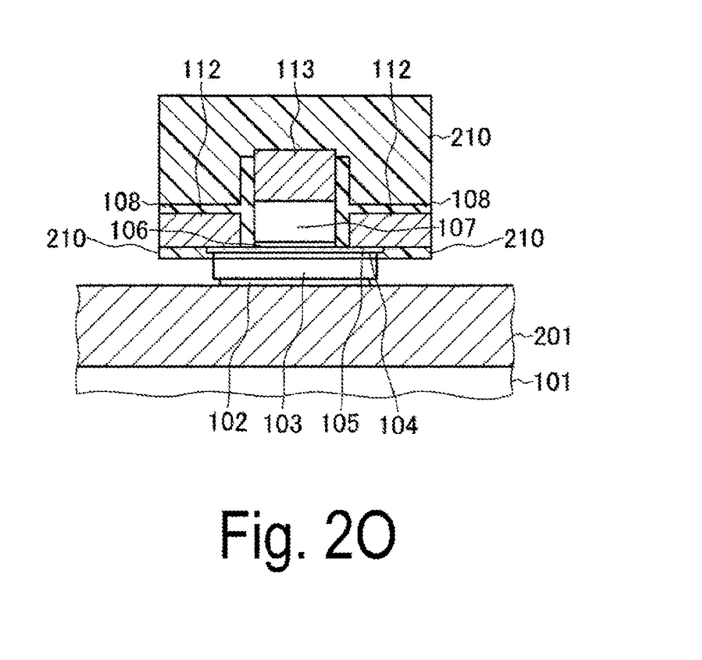
FIG. 2O is a cross-sectional view illustrating a state of an intermediate step for explaining a method of manufacturing the heterojunction bipolar transistor according to an embodiment of the present invention.
Figure 2P:
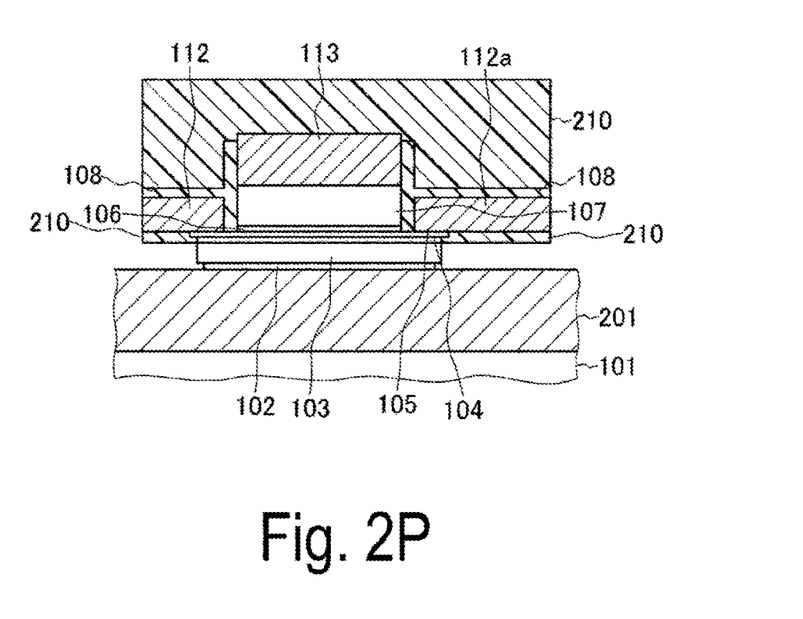
FIG. 2P is a cross-sectional view illustrating a state of an intermediate step for explaining a method of manufacturing the heterojunction bipolar transistor according to an embodiment of the present invention.

Next, after the mask pattern 209 is removed, a mask pattern 210 is newly formed using a known lithography technique as illustrated in FIGS. 2O and 2P. The mask pattern 210 coats the entire surface of the emitter layer 106 and the base electrode 112. In addition, the mask pattern 209 is also formed (filled) directly below the base electrode 112 and the base pad electrode 112a having changed into voids, and prevents the base layer 105 and the second collector layer 104 from being etched.

Subsequently, the first collector forming layer 203 and the collector contact forming layer 202 are etched through an etching process using the mask pattern 210 as a mask, and the first collector layer 103 and the collector contact layer 102 are formed as illustrated in FIGS. 2O and 2P (seventh step). For example, the first collector forming layer 203 can be etched with a hydrochloric acid-based etchant. In addition, similarly to the second collector forming layer 204, the collector contact forming layer 202 can be etched with a citric acid-based etchant. In this etching process, the first collector layer 103 hardly undergoes side etching and has almost the same area as the second collector layer 104, but the area of the collector contact layer 102 is smaller than that of the first collector layer 103.

Figure 1A:
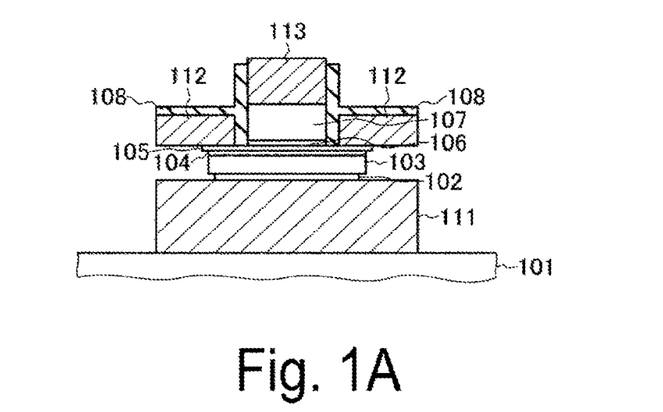
FIG. 1A is a cross-sectional view illustrating a heterojunction bipolar transistor according to an embodiment of the present invention.
Figure 1B:
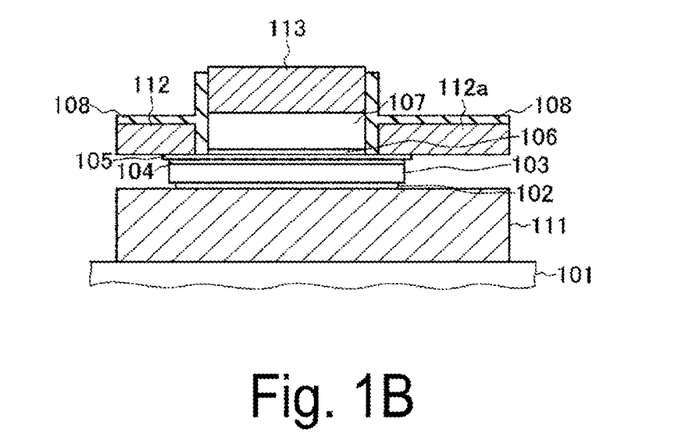
FIG. 1B is a cross-sectional view illustrating the heterojunction bipolar transistor according to an embodiment of the present invention.

Finally, the collector electrode forming layer 201 is patterned using a known lithography technique and a known etching technique to form the collector electrode 111 as illustrated in FIGS. 1A and 1B (eighth step).

As described above, in embodiments of the present invention, a first collector layer composed of InP, a second collector layer which is thinner than the first collector layer and is composed of InGaAs, a base layer composed of GaAsSb or InGaAsSb, an emitter layer having an area smaller than the base layer in a plan view, and a base electrode having a portion that is formed on the base layer around the emitter layer and is in contact with the base layer and a portion that extends from the base layer away from the emitter layer in a plan view are included. As a result, according to embodiments of the present invention, it is possible to reduce base-collector parasitic capacitance and to improve high-frequency characteristics, without increasing the resistance of the base electrode and without reducing the yield rate of element manufacturing.

Meanwhile, the present invention is not limited to the embodiments described above, and it will be obvious to those skilled in the art that various modifications and combinations can be implemented within the technical idea of the present invention. For example, although an npn-type InP/GaAsSb-based HBT on an SiC heat dissipating substrate which is promising in realizing a very-high-speed integrated circuit has been described in detail, the same effect is also effective for other HBTs, specifically, an InP/GaAsSb-based HBT formed on an InP substrate.

REFERENCE SIGNS LIST

101 Substrate
102 Collector contact layer
103 First collector layer
104 Second collector layer
105 Base layer
106 Emitter layer
107 Emitter cap layer
108 Insulating layer
111 Collector electrode
112 Base electrode
112a Base pad electrode
113 Emitter electrode

The invention claimed is:

1. A heterojunction bipolar transistor comprising:
a collector electrode on a substrate;
a first collector layer on the collector electrode, the first collector layer comprising InP;
a second collector layer on the first collector layer, the second collector layer comprising InGaAs and having a thickness smaller than a thickness of the first collector layer;
a base layer comprising GaAsSb or InGaAsSb on the second collector layer;
an emitter layer on the base layer, the emitter layer comprising a compound semiconductor different from that of the base layer and having an area smaller than an area of the base layer in a plan view;
a base electrode, the base electrode having a first portion on the base layer and in contact with the base layer adjacent the emitter layer and a second portion that extends away from the emitter layer in the plan view without being in contact with the base layer; and
an emitter electrode on the emitter layer.

2. The heterojunction bipolar transistor according to claim 1, further comprising a collector contact layer between the collector electrode and the first collector layer, the collector contact layer comprising InGaAs and having an area smaller than an area of the first collector layer in the plan view.

3. The heterojunction bipolar transistor according to claim 2, further comprising a third collector layer between the collector contact layer and the first collector layer, the third collector layer comprising InP.

4. The heterojunction bipolar transistor according to claim 1, wherein:
the first collector layer is composed of n-type InP doped with Si at a first low concentration;
the second collector layer is composed of non-doped InGaAs or n-type InGaAs doped with Si at a second low concentration; and
the second collector layer is directly on the first collector layer.

5. The heterojunction bipolar transistor according to claim 1, wherein the emitter electrode has an area equal to the area of the emitter layer.

6. The heterojunction bipolar transistor according to claim 1, wherein the area of the base layer is greater than an area of the second collector layer in the plan view.

7. A method of manufacturing a heterojunction bipolar transistor, the method comprising:
forming a collector electrode forming layer on a substrate;
forming a first collector forming layer comprising InP on the collector electrode forming layer;
forming a second collector forming layer comprising InGaAs on the first collector forming layer, wherein a thickness of the second collector forming layer is smaller than a thickness of the first collector forming layer;
forming a base forming layer comprising GaAsSb or InGaAsSb on the second collector forming layer;

forming an emitter forming layer comprising a compound semiconductor different from that of the base forming layer on the base forming layer;

forming an emitter electrode on the emitter forming layer;

patterning the emitter forming layer to form an emitter layer;

forming a base electrode on the base forming layer adjacent the emitter layer;

forming a base layer and a second collector layer using a first mask pattern and performing a selective etching process on the first collector forming layer, wherein the emitter layer is formed in an area smaller than an area of the base layer in a plan view, and wherein the base electrode is formed in a shape having a first portion that is in contact with the base layer adjacent the emitter layer and a second portion that extends away from the emitter layer in the plan view without contacting the base layer;

etching the first collector forming layer using a second mask pattern that covers lateral sides of the base layer and the second collector layer to form a first collector layer; and forming a collector electrode from the collector electrode forming layer.

8. The method according to claim 7, wherein forming the base layer and the second collector layer comprises forming the base layer and the second collector layer by selectively etching only the base forming layer and the second collector forming layer.

9. The method according to claim 8, further comprising forming a collector contact layer comprising InGaAs between the collector electrode and the first collector layer, wherein the collector contact layer has an area smaller than an area of the first collector layer in the plan view.

10. The method according to claim 9, further comprising forming a third collector layer comprising InP between the collector contact layer and the first collector layer.

11. The method according to claim 7, further comprising forming a collector contact layer comprising InGaAs between the collector electrode and the first collector layer, wherein the collector contact layer has an area smaller than an area of the first collector layer in the plan view.

12. The method according to claim 11, further comprising forming a third collector layer comprising InP between the collector contact layer and the first collector layer.

* * * * *